(12) United States Patent
Hu et al.

(10) Patent No.: US 6,969,683 B2
(45) Date of Patent: *Nov. 29, 2005

(54) METHOD OF PREVENTING RESIST POISONING IN DUAL DAMASCENE STRUCTURES

(75) Inventors: Rongxiang Hu, San Jose, CA (US);
Yongbae Kim, Cupertino, CA (US);
Sang-Yun Lee, Stanford, CA (US);
Hiroaki Takikawa, Chagasaki (JP);
Shumay Dou, Saratoga, CA (US);
Sarah Neuman, San Mateo, CA (US);
Philippe Schoenborn, San Mateo, CA (US); Keith Chao, Saratoga, CA (US);
Dilip Vijay, Foster City, CA (US); Kai Zhang, Saratoga, CA (US); Masaichi Eda, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 122 days.

This patent is subject to a terminal disclaimer.

(21) Appl. No.: 10/750,348

(22) Filed: Dec. 31, 2003

(65) Prior Publication Data

US 2004/0161927 A1    Aug. 19, 2004

Related U.S. Application Data

(62) Division of application No. 10/025,304, filed on Dec. 19, 2001, now Pat. No. 6,713,386.

(51) Int. Cl.$^7$ ............................................. H01L 21/311
(52) U.S. Cl. ....................... 438/697; 438/700; 438/639
(58) Field of Search ................................. 438/697, 636, 438/639, 689, 690, 691, 692, 694, 695, 696, 438/700, 701, 702, 703, 704, 705, 706, 931, 438/680, 660, 740, 758

(56) References Cited

U.S. PATENT DOCUMENTS

| | | | |
|---|---|---|---|
| 6,436,824 B1 * | 8/2002 | Chooi et al. ................ | 438/687 |
| 6,482,755 B1 | 11/2002 | Ngo et al. ................ | 438/792 |
| 6,528,884 B1 | 3/2003 | Lopatin et al. ............ | 257/758 |
| 6,713,386 B1 * | 3/2004 | Hu et al. .................... | 438/639 |

* cited by examiner

*Primary Examiner*—David Nhu
(74) *Attorney, Agent, or Firm*—Beyer Weaver & Thomas, LLP

(57) ABSTRACT

A method for forming a dual damascene interconnect in a dielectric layer is provided. Generally, a first aperture is etched in the dielectric. A poison barrier layer is formed over part of the dielectric, which prevents resist poisoning. A patterned mask is formed over the poison barrier layer. A second aperture is etched into the dielectric layer, wherein at least part of the first aperture shares the same area as at least part of the second aperture.

16 Claims, 14 Drawing Sheets

METHOD OF PREVENTING RESIST POISONING IN DUAL DAMASCENE STRUCTURES

CROSS-REFERENCE TO RELATED APPLICATIONS

This is a Divisional application of prior U.S. application No. 10/025,304 entitled "METHOD OF PREVENTING RESIST POISONING IN DUAL DAMASCENE STRUCTURES," filed on Dec. 19, 2000 now U.S. Pat. No. 6,713,386, which is incorporated herein by reference.

FIELD OF THE INVENTION

The invention relates to the manufacture of semiconductor devices. More specifically, the invention relates to the manufacture of dual damascene structures in low-K dielectric material.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, K, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-K materials", have been developed.

One interesting class of organic low-K materials is compounds including organosilicate glass. By way of example, but not limitation, such organosilicate dielectrics include CORAL™ from Novellus Systems, Inc. of San Jose, Calif.; Black Diamond™ from Applied Materials of Santa Clara, Calif.; and Sumika Film® available from Sumitomo Chemical America, Inc., Santa Clara, Calif. Another class of low-K materials would be spin-on glass.

During semiconductor wafer processing, features of the semiconductor device have been defined in the wafer using well-known patterning and etching processes. In these processes, a photoresist material may be deposited on the wafer and may then be exposed to light filtered by a reticle. The reticle may be a glass plate that is patterned with exemplary feature geometries that block light from propagating through the reticle.

During the photoresist layer forming, the photoresist may become nitrogen poisoned. This nitrogen poisoning may cause photoresist to adhere to where it should not be, which may prevent the etching of an area of the low-K dielectric, where etching may be desired. Thus, nitrogen poisoning may prevent proper mask patterning by preventing developed photoresist from being removed.

To facilitate understanding, FIG. 1 is a flow chart of a dual damascene etching process that may be used in the prior art. During such a process, a low-K layer and barrier layer may be formed on a substrate (step 104). FIG. 2 is a cross-sectional view of a barrier layer 202 and a low-K layer 204 on a substrate 208. The substrate may be semiconductor devices or an interconnect layer or other layers. If the substrate 208 is a copper interconnect, the barrier layer 202 may be a silicon carbide layer with added nitrogen to prevent the substrate from copper diffusion into the low-K layer 204. The low-K layer 204 may form an inter layer dielectric. An etch stop layer 212 may be placed within the low-K layer 204. A protective layer 216, such as a modified low-K layer or oxide layer, may be formed on the surface of the low-K layer 204. An anti-reflective coating (ARC) 220 may be formed on the surface of the low-K layer (step 108). The ARC may be a spun-on organic ARC or an inorganic deposited film ARC, such as PEARL™ manufactured by Novellus™. A patterned mask 224 for etching vias is formed over the antireflective coating 220 (step 112). Typically, such a mask is formed with a photoresist material.

The patterned mask is used to etch vias 304, as shown in FIG. 3 (step 116). The via forming mask may then be removed by ashing the via forming mask (step 120). A bottom antireflective coat (BARC) 308 may be formed (step 124) and then etched back (step 128) on the bottom of the via 304. The BARC may typically be an organic spun-on material. A patterned trench mask 404 may then be formed (step 132), as shown in FIG. 4. The desired trench is shown by broken lines 408. However, due to nitrogen poisoning of the photoresist by nitrogen, possibly from the barrier layer or inorganic ARC, photoresist residue 412 over the desired trench adheres to the low-K material and is not removed as desired. The trench is the etched (step 136).

The photoresist residue 412 prevents etching of the trench under the residue 412. As a result, only parts of the trench 416 may be etched.

The patterned trench mask 404 may then be removed by ashing (step 140). The substrate may be heated to provide annealing and degassing (step 144) to remove gases and moisture. A barrier layer may be formed (step 148). Copper may be deposited over the barrier layer (step 152) to form conductive interconnects. Chemical mechanical polishing may be used to provide a smooth upper surface (step 156).

Without being limited by theory, it is believed that, for some photoresist, light causes the photoresist to produce a small mount of acid. The small amount of acid may be used as a catalyst to produce more acid, which cause a reaction to form a pattern. The presence of a base material, such as nitrogen, may cause the neutralization of the small amount of acid, which may prevent the generation of more acid, so that the pattern is not developed. As a result, the photoresist may not be removed at the locations desired. Accordingly, nitrogen, which is a component of inorganic ARC and the silicon carbide barrier layer 202, may migrate through the low-K material and through the BARC to the photoresist, which may poison a region of the photoresists and which may prevent parts of the photoresist from properly developing.

SUMMARY OF THE INVENTION

To achieve the foregoing and in accordance with the purpose of the present invention, a method for forming a dual damascene interconnect in a dielectric layer is provided. Generally a first aperture is etched in the dielectric. A poison barrier layer is formed over part of the dielectric, which prevents resist poisoning. A patterned mask is formed over the poison barrier layer. A second aperture is etched into the dielectric layer, wherein at least part of the first aperture shares the same area as at least part of the second aperture.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

A proper treatment of the surface of the low-K, or the inorganic ARC, or any exposed surface after the opening of the first aperture, can reduce or eliminate the resist poisoning. This method for treatment is described in detail below.

Figure 1:
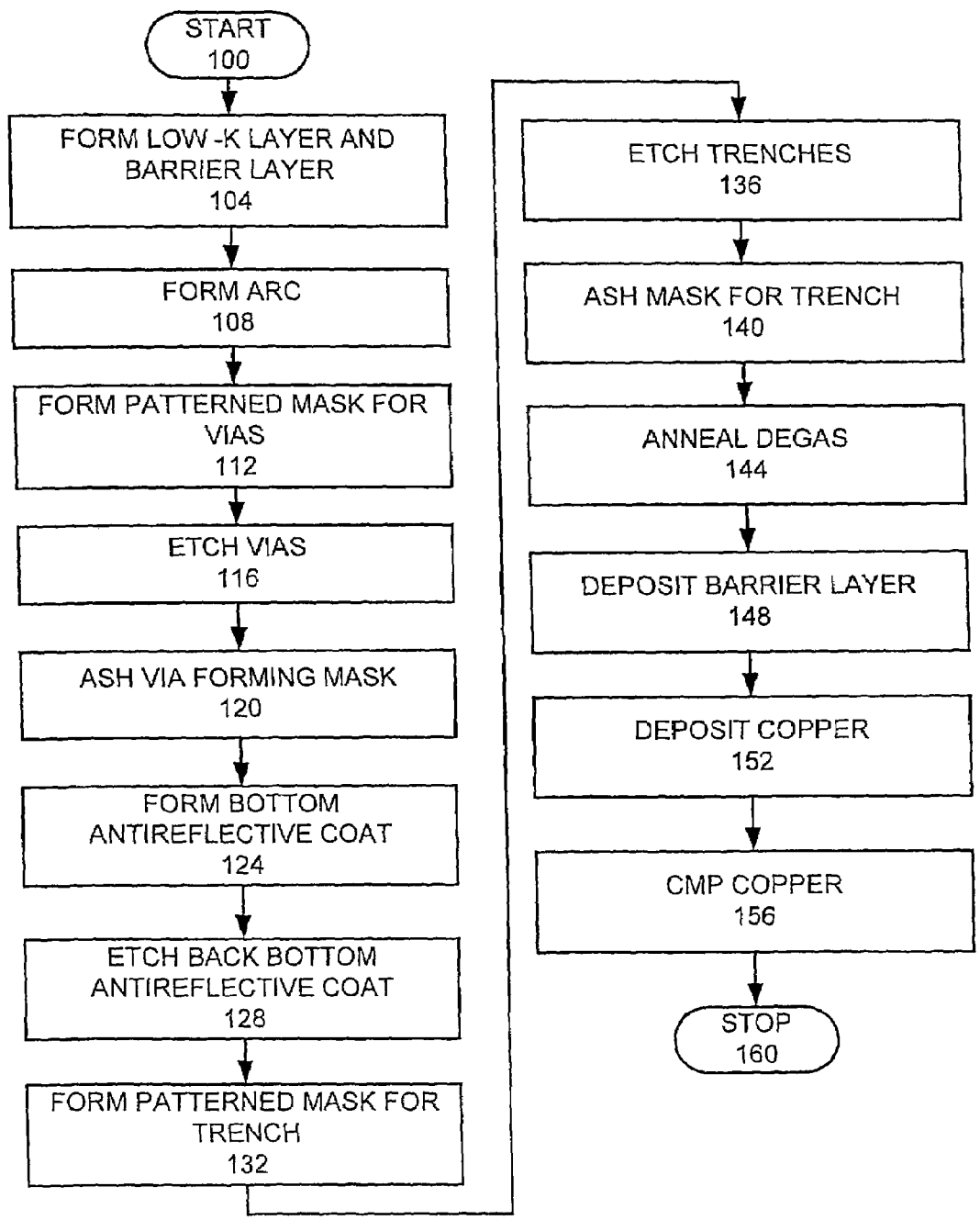
FIG. 1 is a flowchart representation of a dual damascene process used in the prior art.
Figure 2:
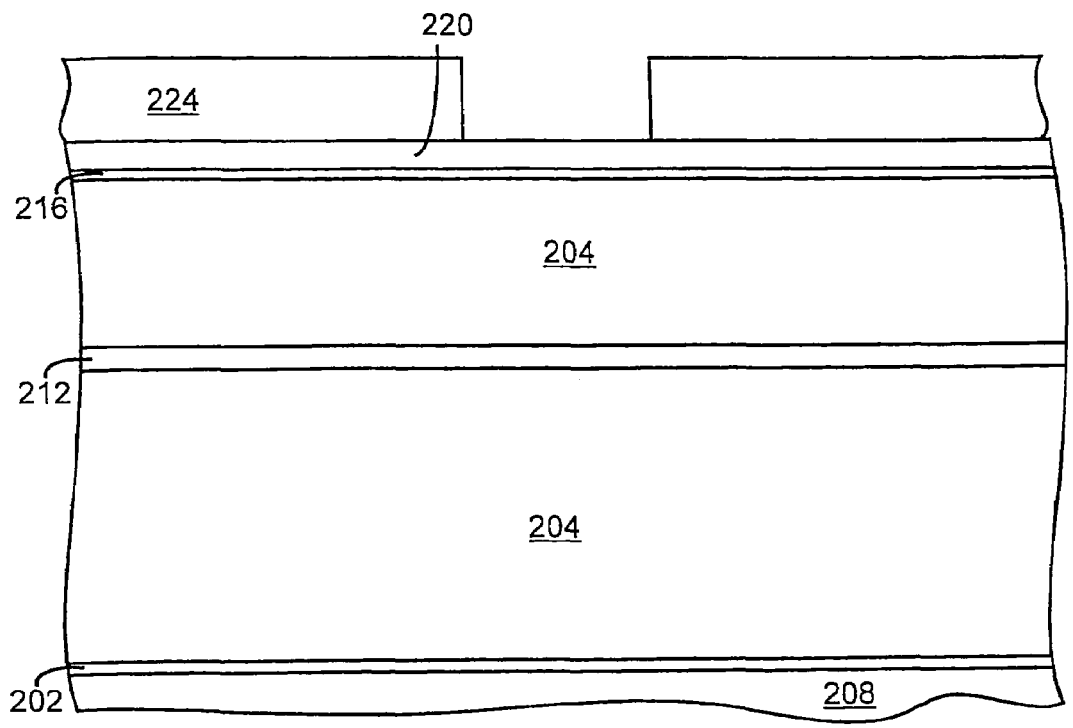
FIG. 2 is a cross-sectional view of a substrate with a low-K layer used in the prior art.
Figure 3:
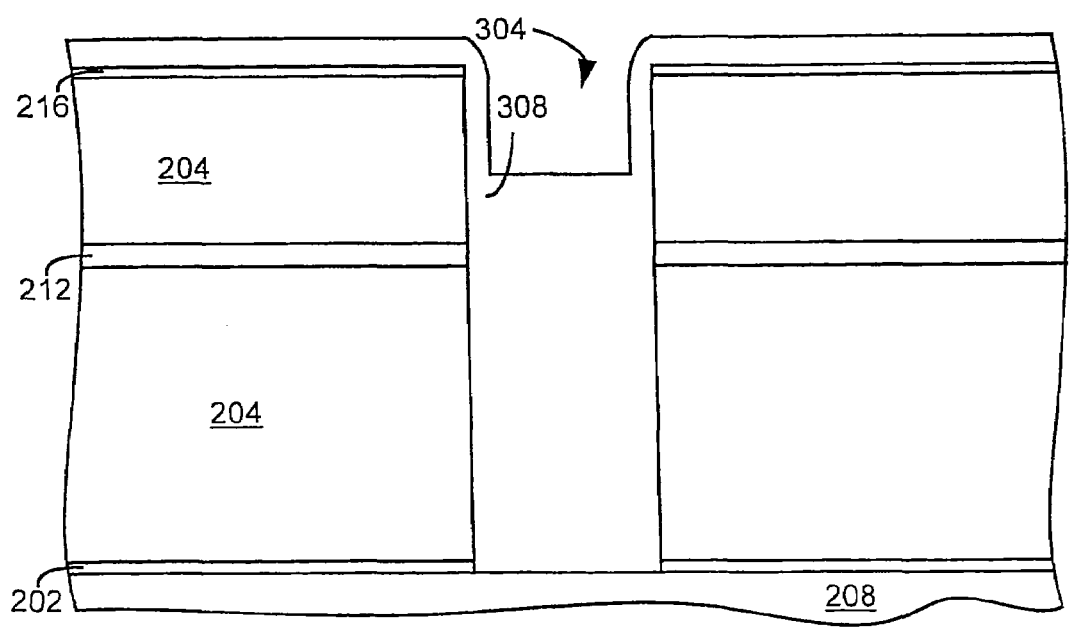
FIG. 3 is a cross-sectional view of the substrate illustrated in FIG. 2 after a via has been etched in the prior art.
Figure 4:
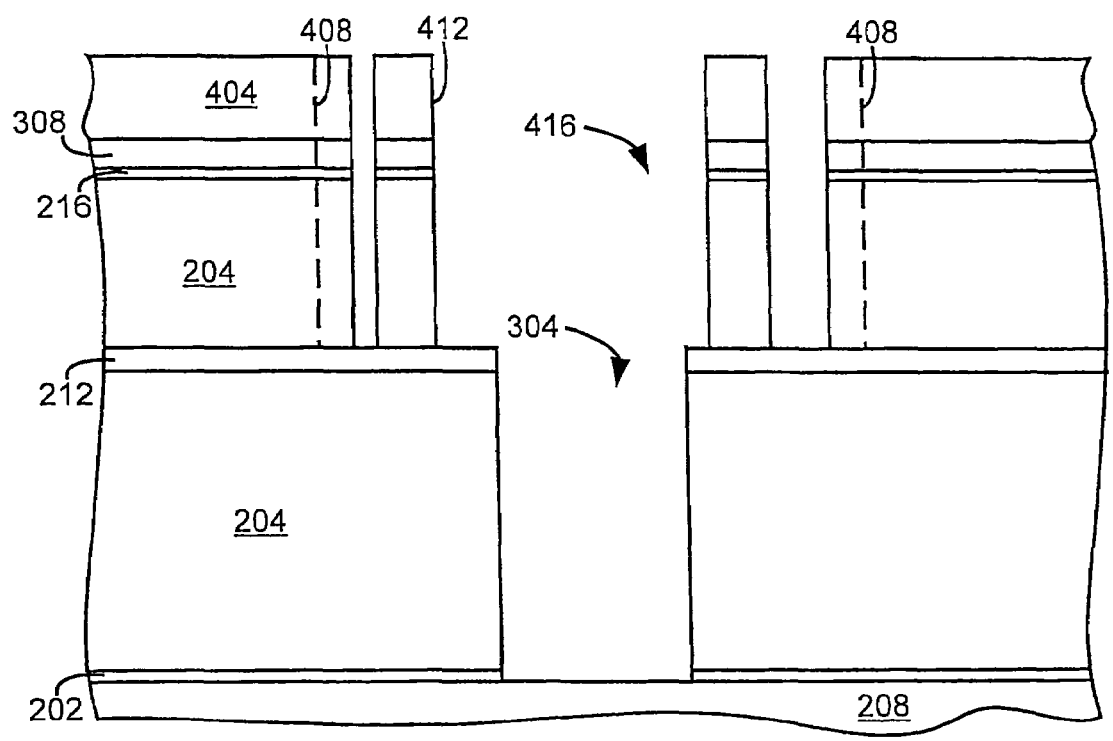
FIG. 4 is a cross-sectional view of the substrate illustrated in FIG. 3 after a trench has been etched in the prior art.
Figure 5:
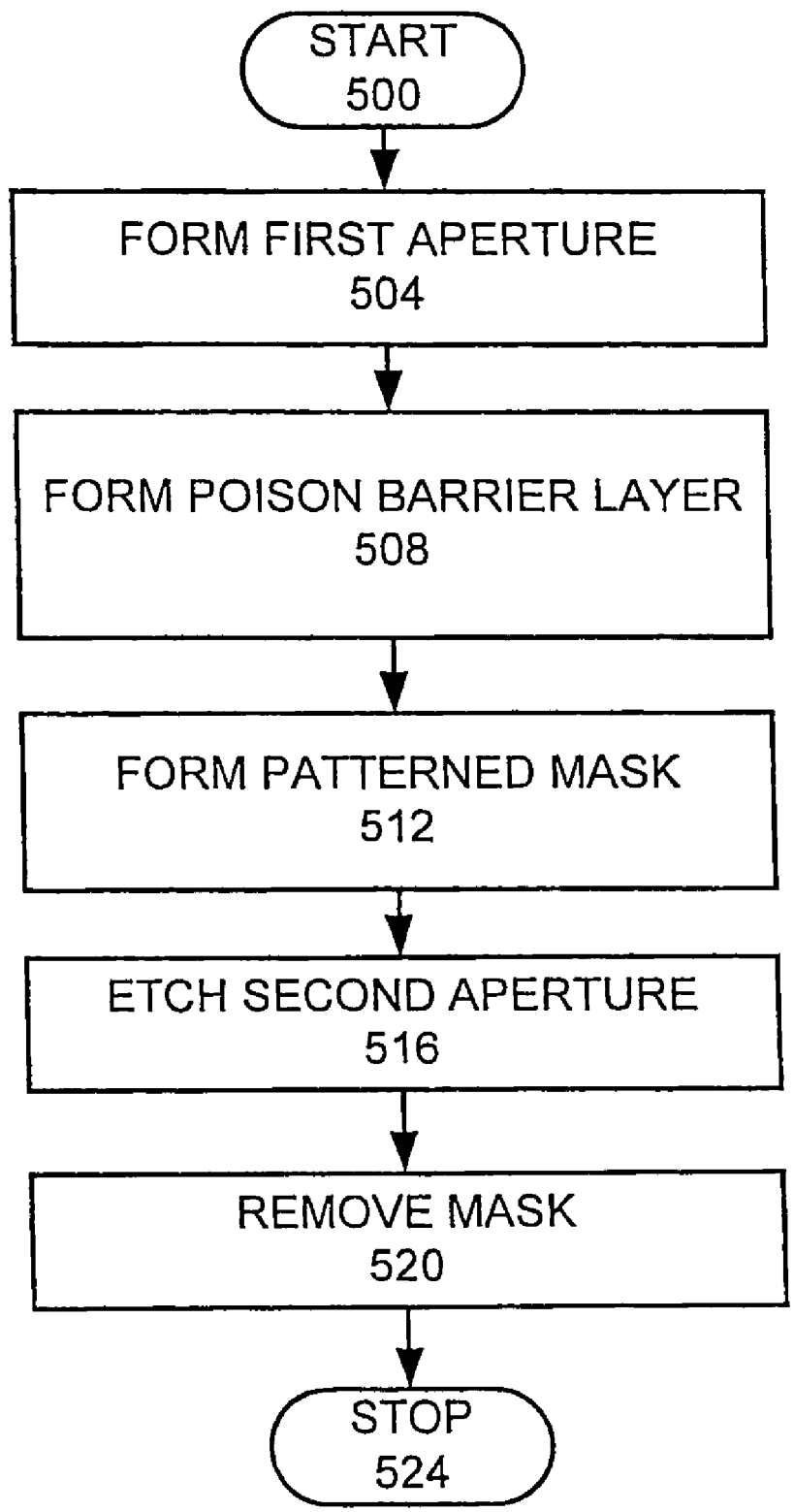
FIG. 5 is a flow chart of a process used in the invention.

FIG. 5 is a high level flow chart of an embodiment of the inventive process. At least one first aperture is formed in a low-K dielectric layer (step 504). A poison barrier layer is formed (step 508). A poison barrier layer is a layer that forms a barrier that blocks nitrogen, which has a base quality thus providing a nitrogen barrier that provides a resist poisoning barrier layer. This may be achieved by creating a barrier to all nitrogen or by neutralizing the base quality of nitrogen. A patterned photoresist mask is formed on the surfaces of the first aperture (step 512). A second aperture is then etched using the patterned mask (step 516). At least part of the first aperture shares the same area as at least part of the second aperture. More preferably, one aperture is within another aperture. The mask is then removed (step 520).

Figure 6:
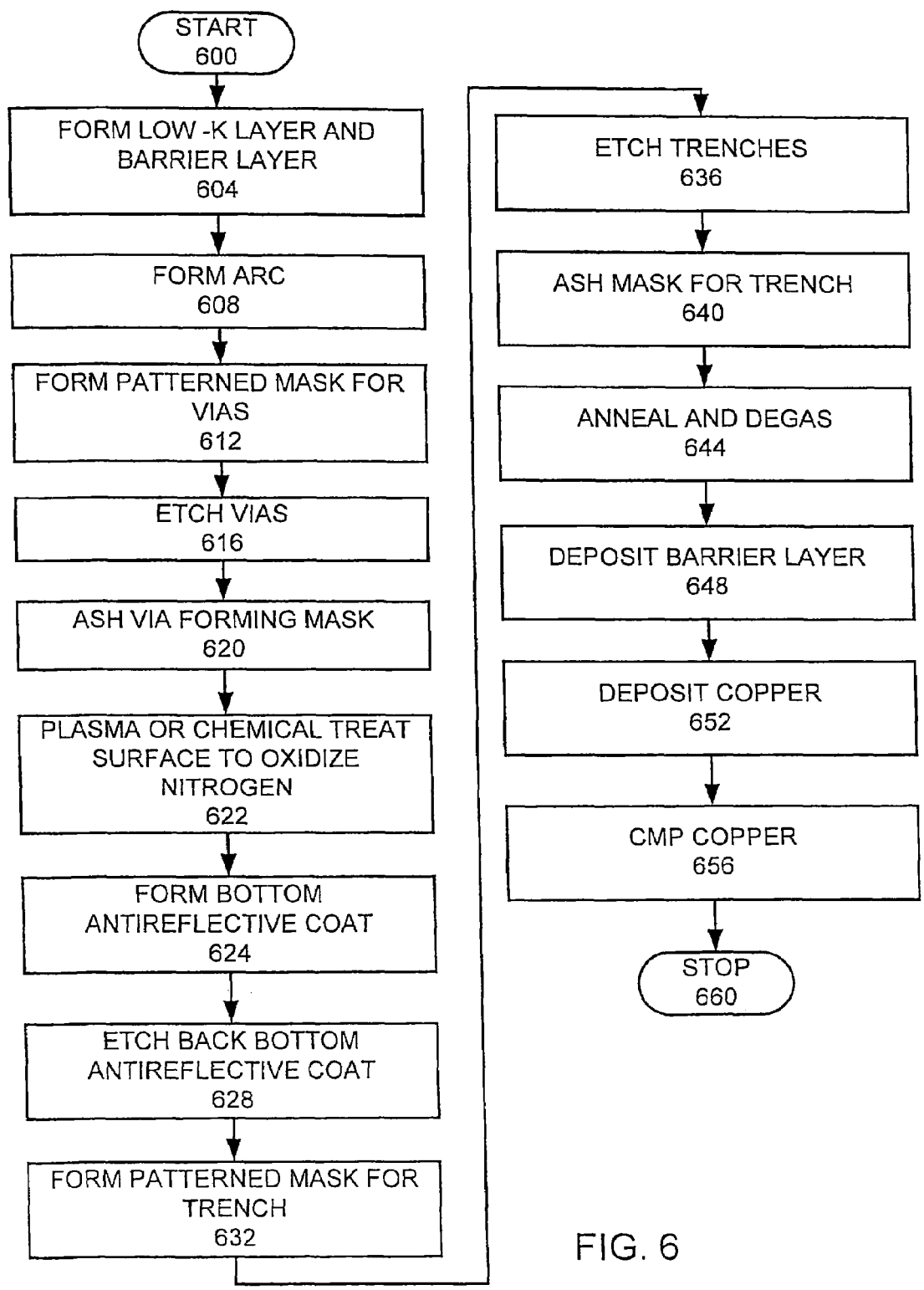
FIG. 6 is a more detailed flow chart of an embodiment of the invention.
Figure 7:
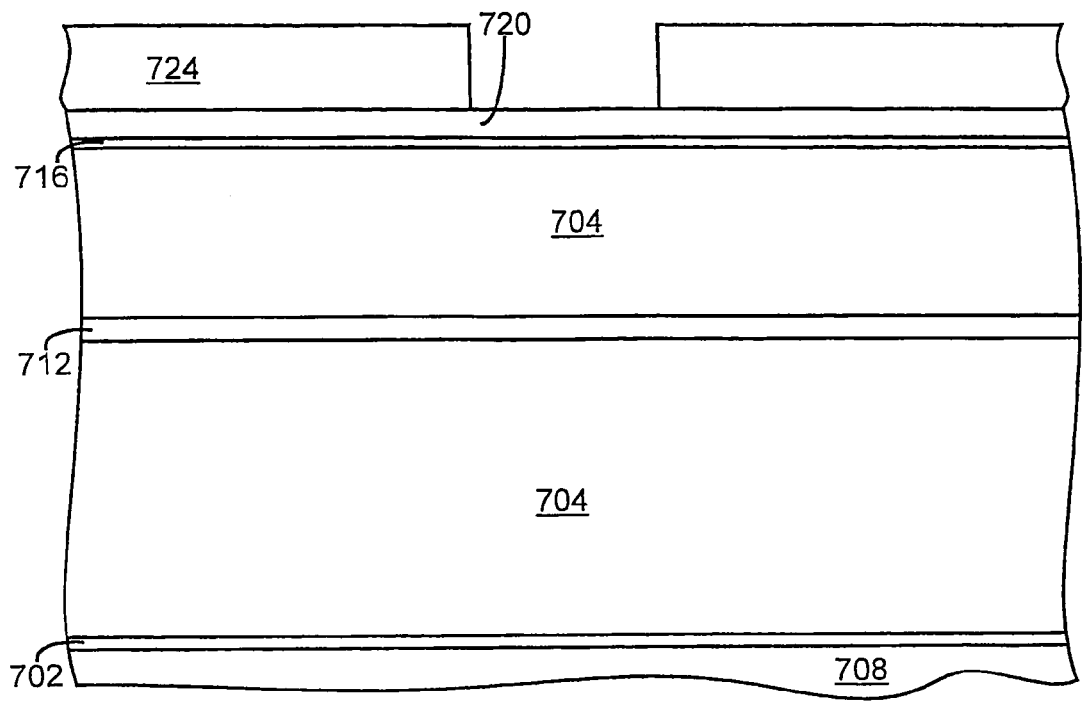
FIG. 7 is a cross-sectional view of a substrate with a low-K layer used in an embodiment of the invention.

FIG. 6 is a more detailed flow chart of a preferred embodiment of the invention. A low-K layer and barrier layer may be formed on a substrate (step 604). FIG. 7 is a cross-sectional view of a low-K layer 704 over a barrier layer 702 on a substrate 708. The substrate may be semiconductor devices or an interconnect layer or other layers. If the substrate is a copper interconnect, the barrier layer 702 may be a silicon carbide layer with added nitrogen, which keeps the copper substrate 708 from copper diffusing into the low-K layer 704. The low-K layer 704 may form an inter layer dielectric. The low-K layer 704 may have an etch stop layer 712. A protective layer 716, such as a modified low-K layer or oxide layer, may be formed on the surface of the low-K layer 704. An anti reflective coating (ARC) 720 may be formed on the surface of the low-K layer (step 608) or on the protective layer if there is one in place. The ARC may be a spun-on organic ARC or an inorganic deposited film ARC, such as PEARL™ manufactured by Novellus™. A patterned mask 724 for etching vias is formed over the antireflective coating 720 (step 612). Typically such a mask is formed with a photoresist material.

Figure 8:
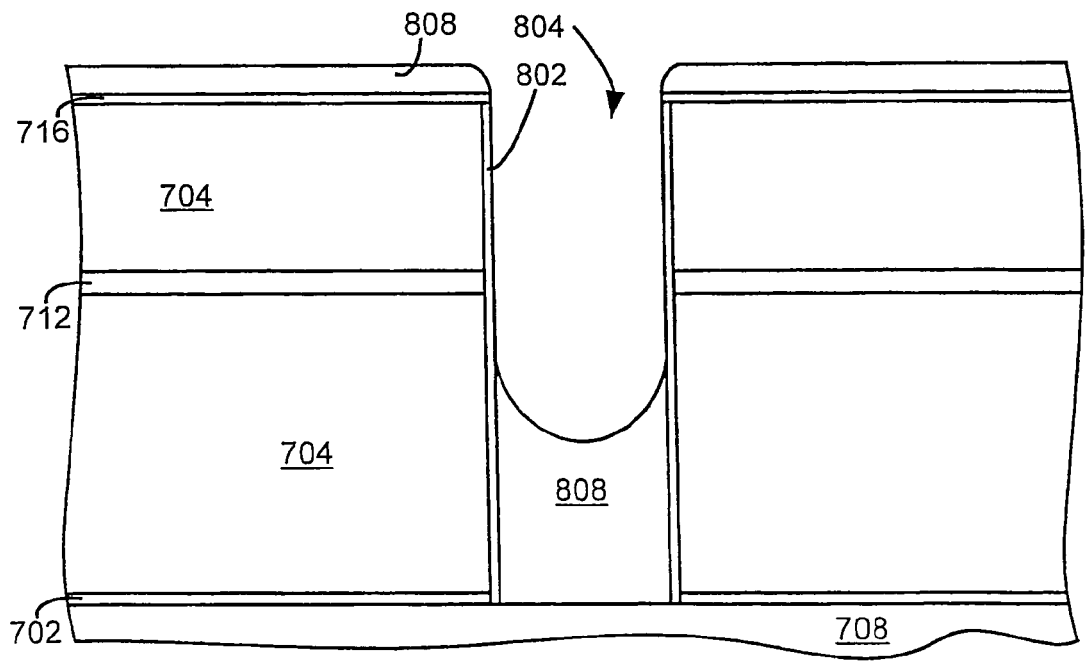
FIG. 8 is a cross-sectional view of the substrate illustrated in FIG. 7 after a via has been etched.

The patterned mask is used to etch vias 804, as shown in FIG. 8 (step 616). The via forming mask and antireflective coating may then be removed by ashing the via forming mask (step 620). Steps 604 to 620 are one embodiment of performing the step of forming a first aperture (step 504) in FIG. 5, where the first aperture is a via. A plasma or chemical treatment of the surface of the via is used to oxidize the nitrogen on the surface of the via (step 622). Such a treatment may be provided by exposing the low-K layer to a plasma of an oxygen containing gas, such as oxygen, carbon dioxide, carbon monoxide, ozone, water, or hydrogen-peroxide, which forms a protective layer 802 with neutralized nitrogen. The protective layer may also be a silicon oxide layer deposited by chemical reaction. This step is one example of the step of forming a poison barrier layer to prevent nitrogen from poisoning resist around the first aperture (step 508).

Figure 9:
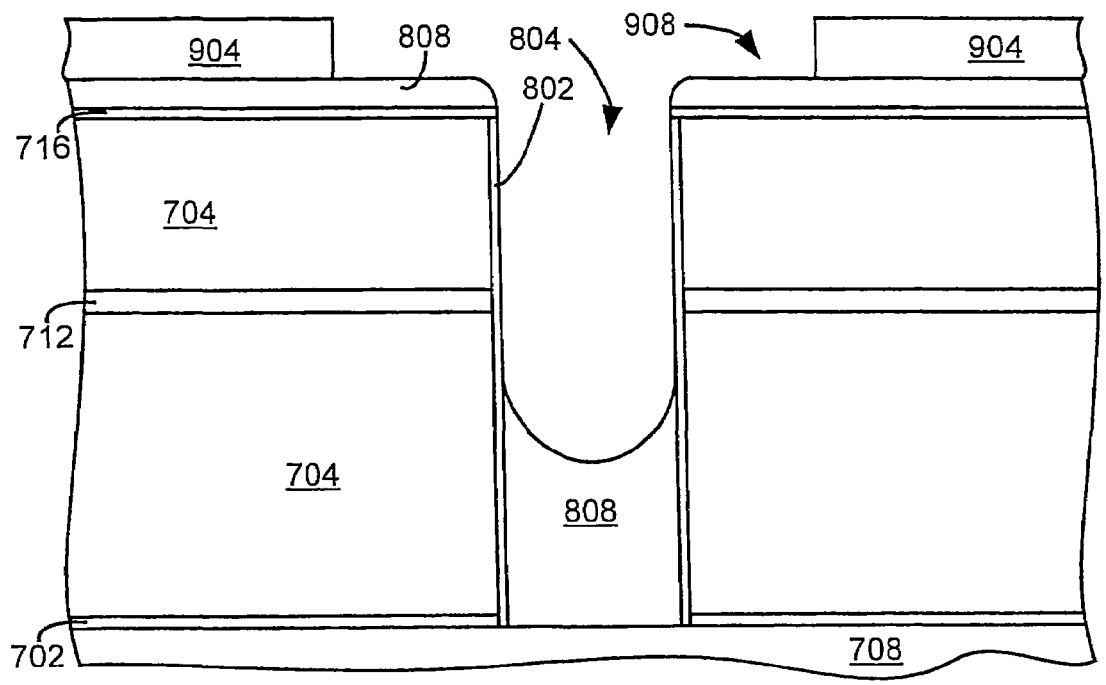
FIG. 9 is a cross-sectional view of the substrate illustrated in FIG. 8 after a trench mask has been patterned.
Figure 10:
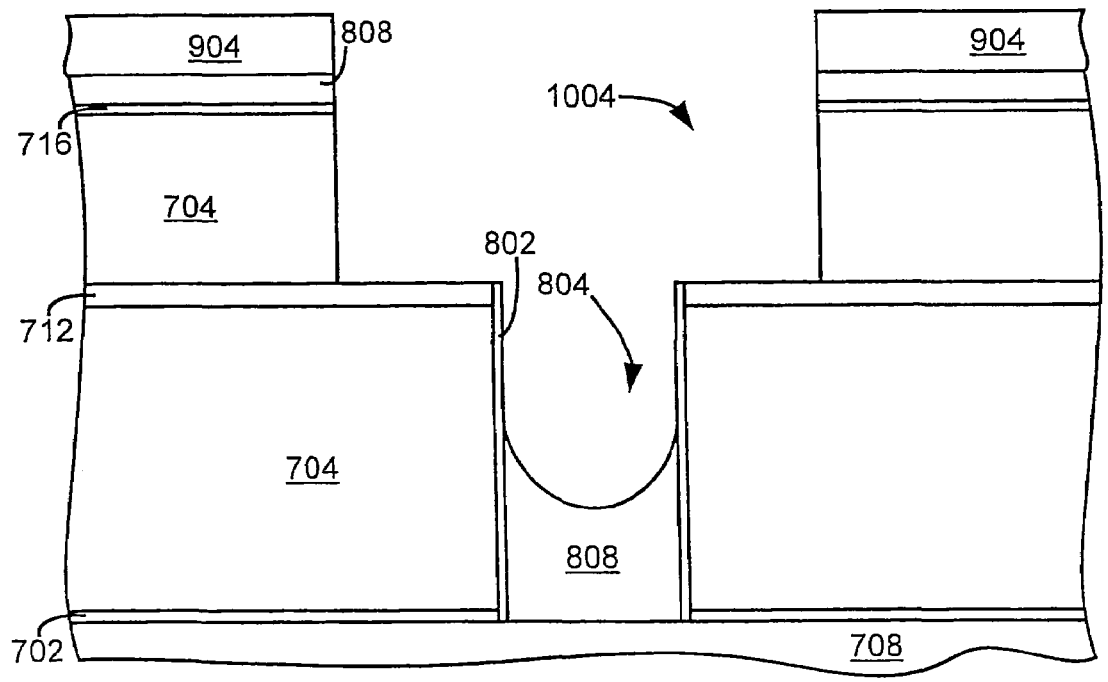
FIG. 10 is a cross-sectional view of the substrate illustrated in FIG. 9 after a trench has been etched.

A bottom antireflective coat (BARC) 808 may be formed (step 624) and then etched back (step 628) on the bottom of the via 804. The BARC may typically be an organic spun-on material. A patterned trench mask 904 may then be formed (step 632), as shown in FIG. 9. This step is an example of the step of forming a patterned mask (step 512). The protective layer 802 prevents base nitrogen from migrating from the via opening 804 through the BARC 808 to the photoresist 904. As a result, acid formed during the developing of the photoresist is not neutralized, allowing for the formation of a trench opening 908 during the forming of the patterned mask, without photoresist adhering to locations in the trench opening. A trench 1004 is then etched, as shown in FIG. 10, using the patterned mask 904 (step 636).

Figure 11:
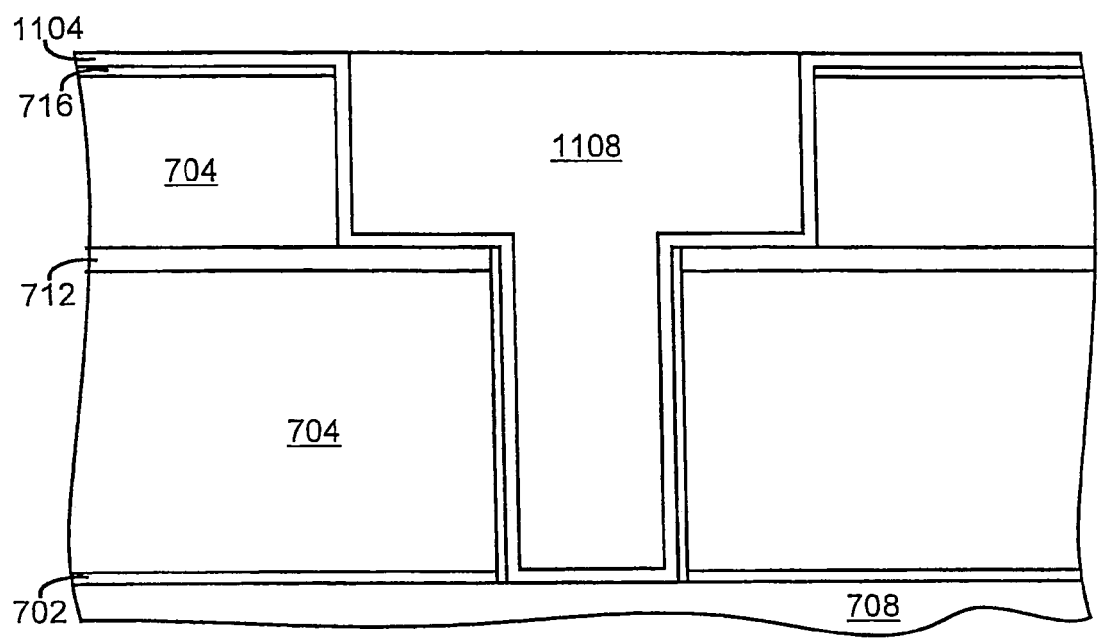
FIG. 11 is a cross-sectional view of the substrate illustrated in FIG. 10 after a copper interconnect has been formed.

The patterned trench mask may then be removed by ashing (step 640), which is an example of step 520. In this embodiment, the trench is the second aperture. As shown, the via is contained in the area of the trench, so that in this example all of the first aperture, the via, shares the same area as part of the second aperture, the trench. The substrate may be heated to provide annealing and degassing (step 644) to remove gases and moisture. A barrier layer 1104 may be formed, as shown in FIG. 11 (step 648). Copper may be deposited over the barrier layer (step 652) to form conductive interconnects 1108. Chemical mechanical polishing may be used to provide a smooth upper surface (step 656) of the conductive interconnects 1108. When, as in this example, the nitrogen neutralization layer is placed below the BARC, the BARC is not made of a nitrogen containing material.

In an alternative embodiment, a plasma treatment of the surface reduces the nitrogen, instead of oxidizing the nitrogen. This may be accomplished by using a hydrogen containing gas, such as hydrogen or ethane, as the source gas for the plasma. In another embodiment, where the plasma source gas contains $SiH_4$, a silicon rich layer may be deposited on the side wall, in addition to the surface nitrogen being neutralized.

Figure 12:
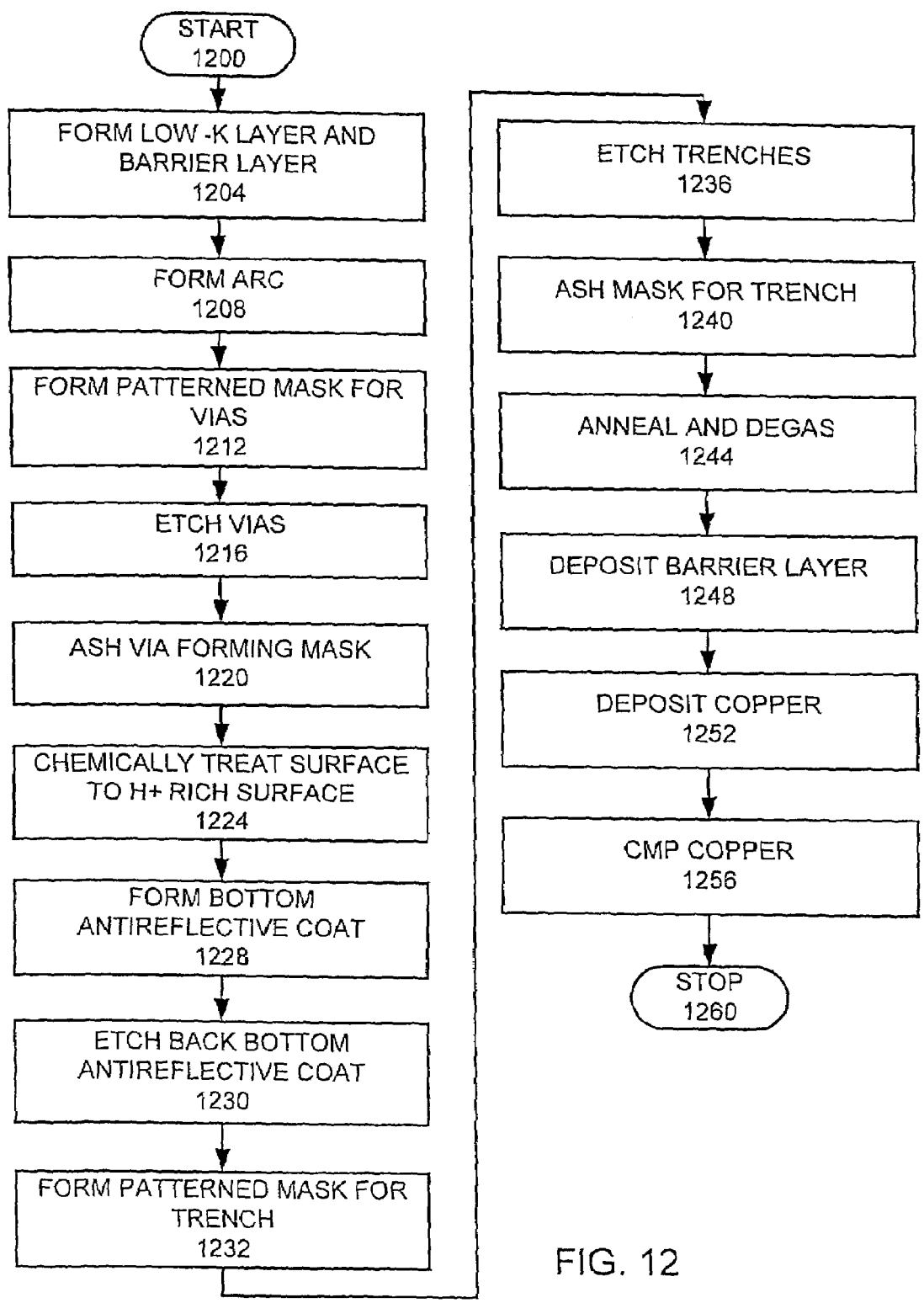
FIG. 12 is a detailed flow chart of another embodiment of the invention.
Figure 13:
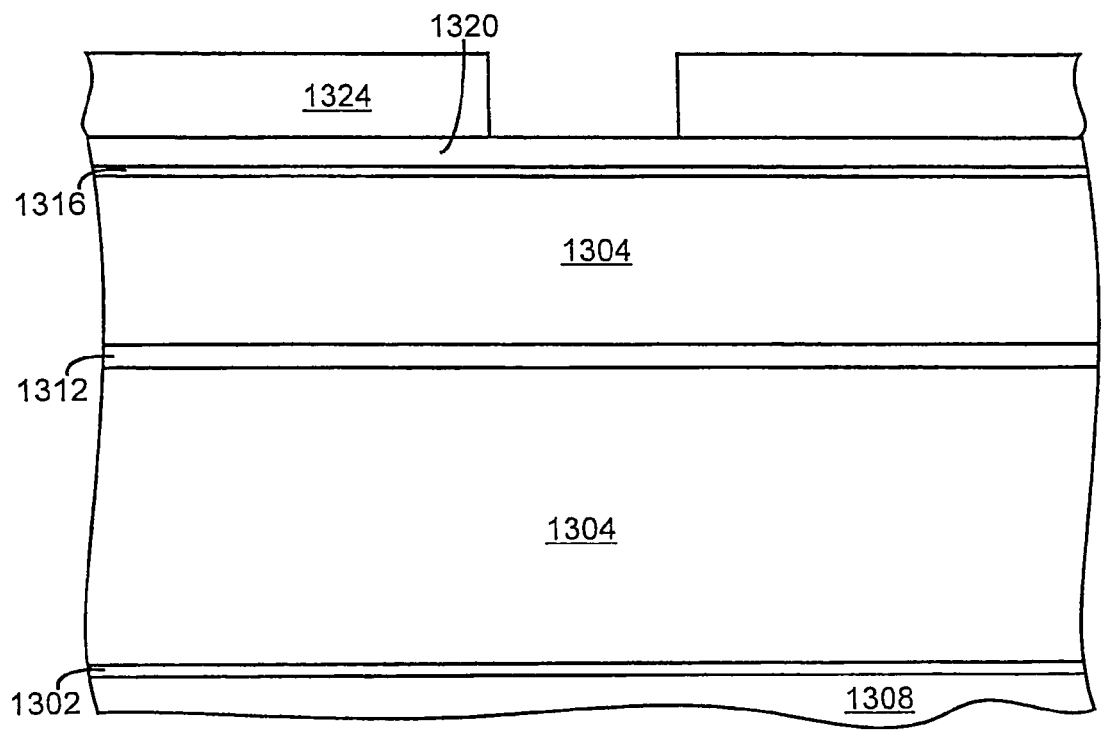
FIG. 13 is a cross-sectional view of a substrate with a low-K layer used in the embodiment of the invention illustrated in FIG. 12.

FIG. 12 is a more detailed flow chart of another preferred embodiment of the invention. A low-K layer and barrier layer may be formed on a substrate (step 1204). FIG. 13 is a cross-sectional view of a low-K layer 1304 over a barrier layer 1302 on a substrate 1308. The substrate may be semiconductor devices or an interconnect layer or other layers. If the substrate is a copper interconnect, the barrier layer 1302 may be a silicon carbide layer with added nitrogen which keeps the copper substrate 1308 from copper diffusing into the low-K layer 1304. The low-K layer 1304 may form an inter layer dielectric and may have an etch stop layer 1312. A protective layer 1316, such as a modified low-K or oxide layer, may be formed on the surface of the low-K layer 1304. An anti reflective coating (ARC) 1320 may be formed on the surface of the low-K layer (step 1208) or on the protective layer if there is one in place. The ARC may be a spun-on organic ARC or an inorganic deposited film ARC, such as PEARL™ manufactured by Novellus™. A patterned mask 1324 for etching vias is formed over the antireflective coating 1320 (step 1212). Typically, such a mask is formed with a photoresist material.

Figure 14:
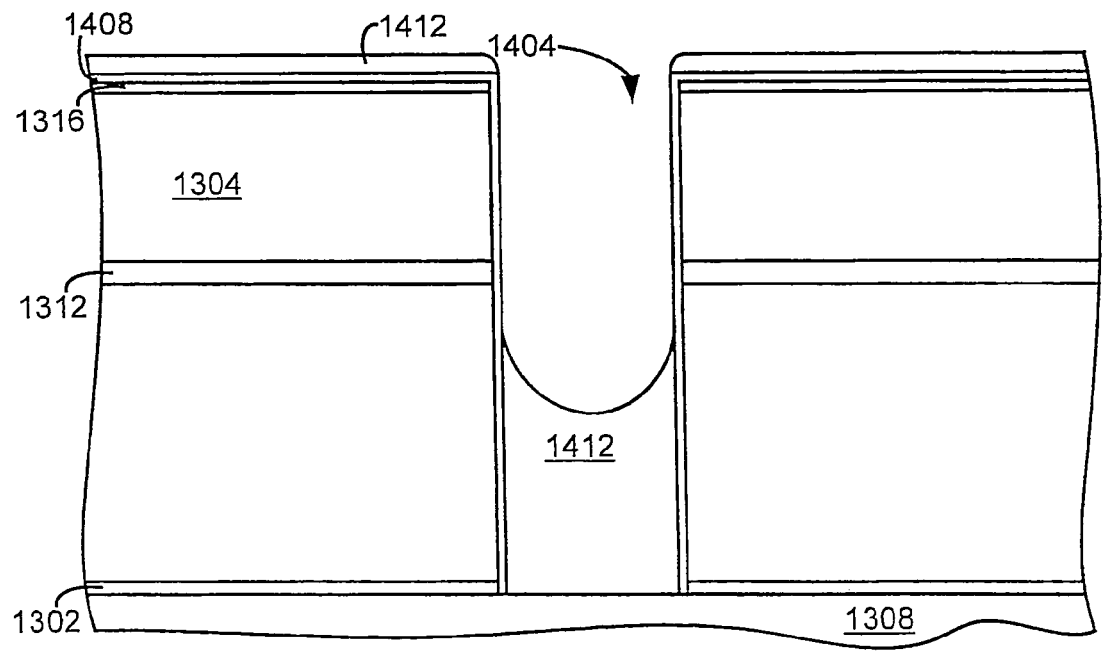
FIG. 14 is a cross-sectional view of the substrate illustrated in FIG. 13 after a via has been etched.

The patterned mask is used to etch vias 1404, as shown in FIG. 14 (step 1216). Therefore, in this example, the first aperture is a via. The via forming mask and antireflective coating may then be removed by ashing the via forming mask (step 1220). The surface of the via 1404 and the top wafer surface may be chemically treated to provide a surface 1408 that is $H^+$ rich (step 1224). Such a treatment may be a wet chemical treatment with an acid (a solution where the pH is less than 7) by exposing the wafer surface to such a solution. Such a treatment may be used to neutralize nitrogen from the surface, due to the fact that the extra $H^+$ on the same surface will be enough to compensate for the loss of acid in developed resist by nitrogen poisoning. These steps are another example of the step of forming a poison barrier around the first aperture (step 508). Although the barrier does not block nitrogen, the presence of $H^+$ blocks the base effect of nitrogen. A bottom antireflective coat (BARC) 1412 may be formed (step 1228) and then etched back (step 1230) on the bottom of the via 1404.

Figure 15:
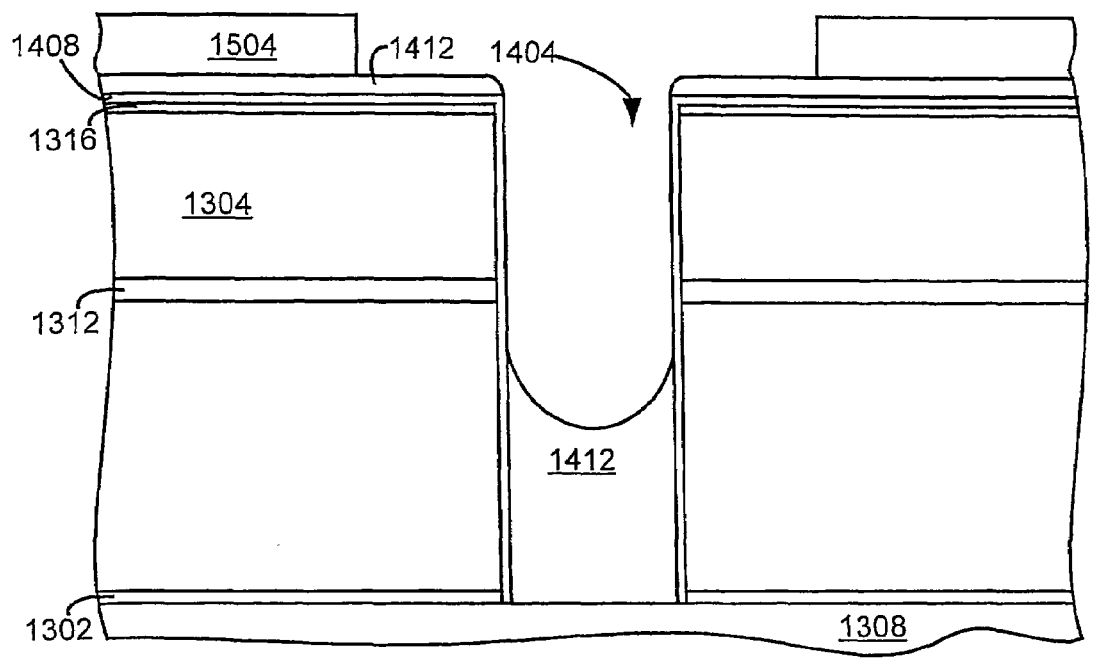
FIG. 15 is a cross-sectional view of the substrate illustrated in FIG. 14 after a trench mask has been patterned.
Figure 16:
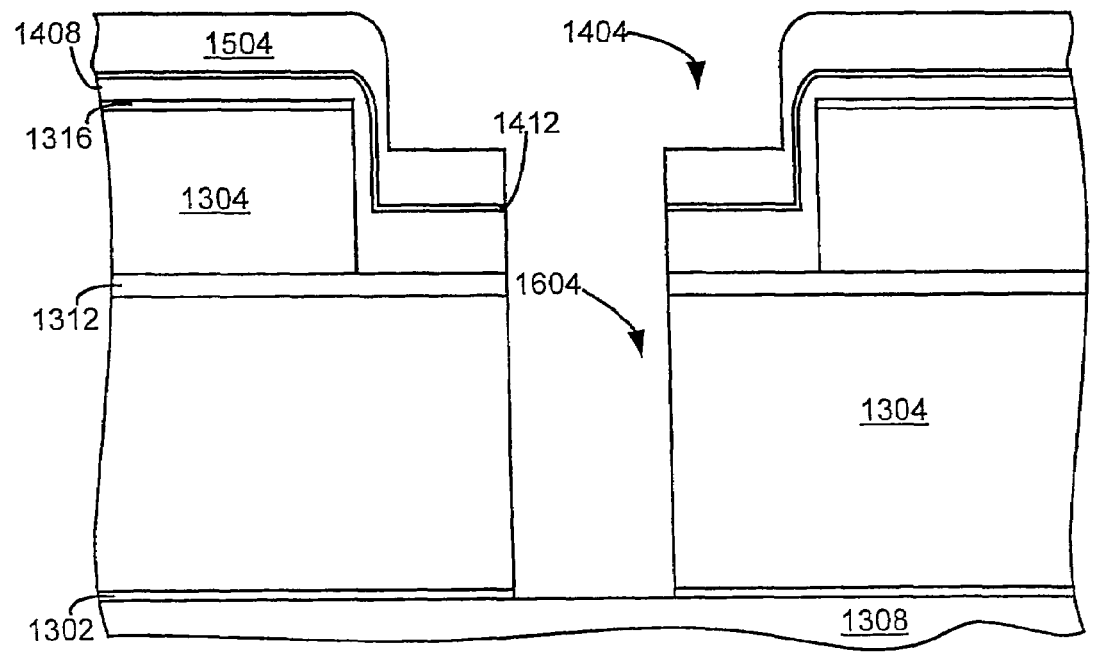
FIG. 16 is a cross-sectional view of the substrate illustrated in FIG. 15 after a trench has been etched.

A patterned trench mask 1504 may then be formed (step 1232), as shown in FIG. 15. The surface 1408 is able to prevent nitrogen poisoning from nitrogen migrating from the barrier layer 1302. As a result, acid formed during the developing of the photoresist is not neutralized, allowing for the formation of a trench opening 1508 during the forming of the patterned mask, without photoresist adhering to locations in the trench opening. A trench 1604 is then etched, as shown in FIG. 16, using the patterned mask 1504 (step 1236), so that, in this example, the second aperture is a trench.

The patterned trench mask may then be removed by ashing (step 1240). The BARC 1408 and the surface 1412 may also be removed during the ashing. The substrate may be heated to provide annealing and degassing (step 1244) to remove gases and moisture. A barrier layer may be formed (step 1248). Copper may be deposited over the barrier layer (step 1252) to form conductive interconnects. Chemical mechanical polishing may be used to provide a smooth upper surface (step 1256) of the conductive interconnects.

Figure 17:
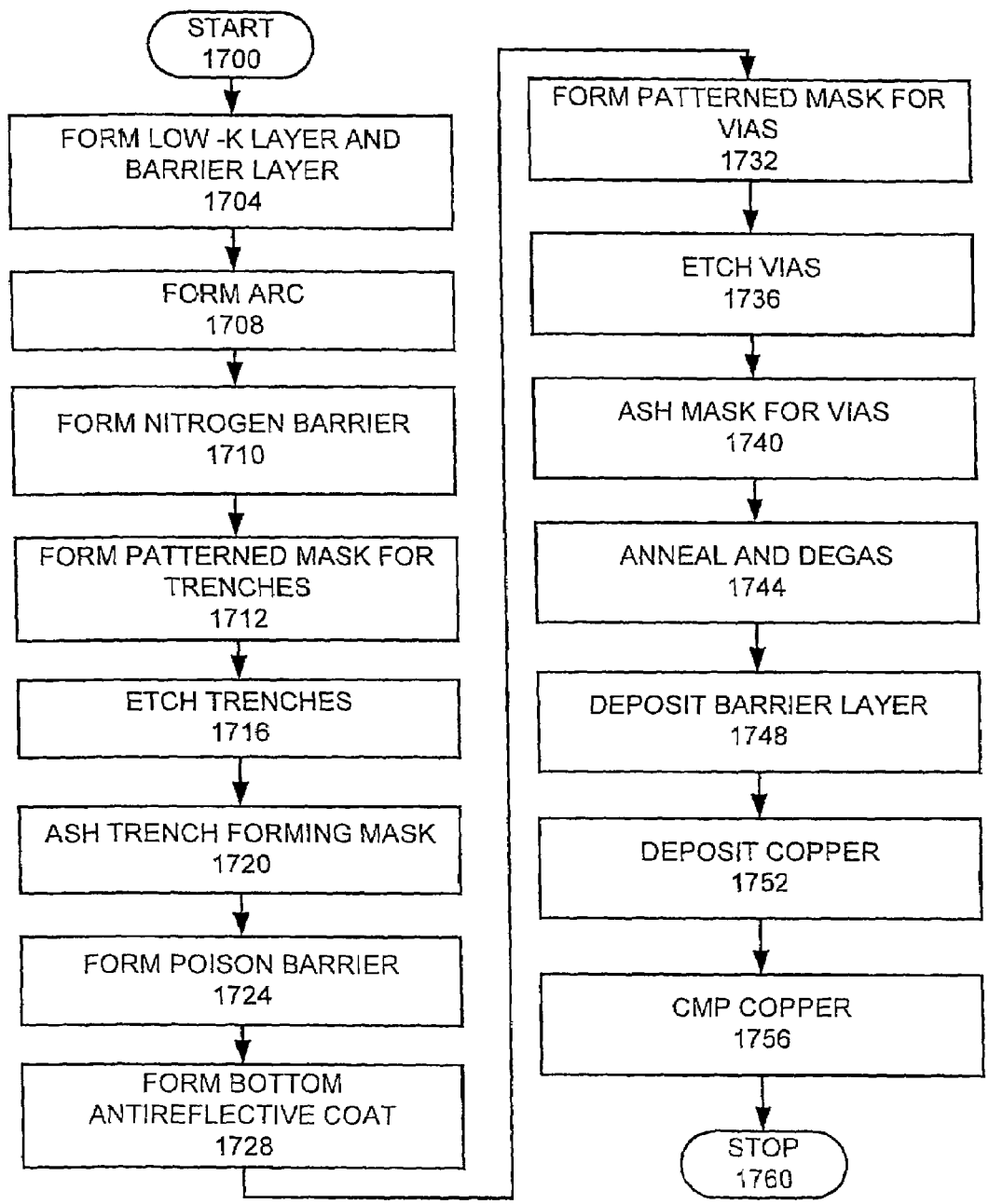
FIG. 17 is a detailed flow chart of another embodiment of the invention.
Figure 18:
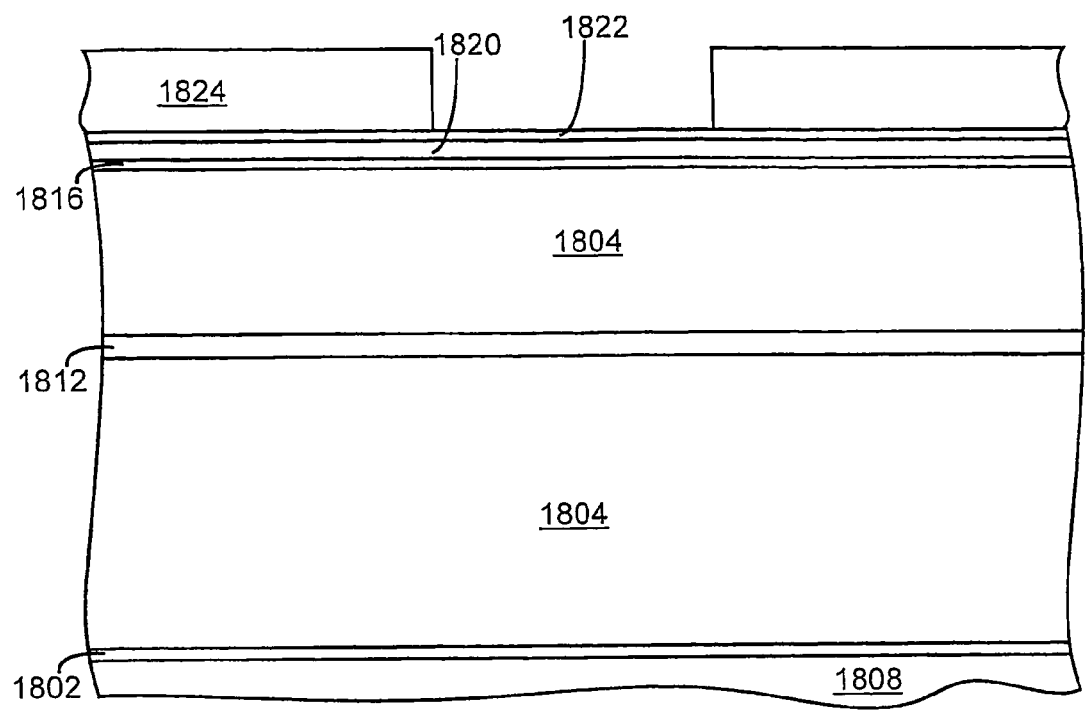
FIG. 18 is a cross-sectional view of a substrate with a low-K layer used in the embodiment of the invention illustrated in FIG. 17.

FIG. 17 is a more detailed flow chart of another preferred embodiment of the invention. A low-K layer and barrier layer may be formed on a substrate (step 1704). FIG. 18 is a cross-sectional view of a low-K layer 1804 over a barrier layer 1802 on a substrate 1808. The substrate may be semiconductor devices or an interconnect layer or other layers. If the substrate is a copper interconnect, the barrier layer 1802 may be a silicon carbide layer with added nitrogen which keeps the copper substrate 1808 from copper diffusing into the low-K layer 1804. The low-K layer 1804 may form an inter layer dielectric and may have an etch stop layer 1812. A protective layer 1816, such as a modified low-K layer or oxide layer, may be formed on the surface of the low-K layer 1804. An anti-reflective coating (ARC) 1820 may be formed on the surface of the low-K layer (step 1708) or on the protective layer if there is one. The ARC may be a spun-on organic ARC or an inorganic deposited film ARC, such as PEARL™ manufactured by Novellus™. A poison barrier layer 1822, to prevent nitrogen from poisoning the resist, may be formed over the ARC 1820. This may be accomplished by using a chemical vapor deposition to deposit silicon and oxygen to form an oxide layer, or by depositing other films that do not contain nitrogen. Such a poison barrier layer is especially desirable if the ARC is PEARL (step 1710), since PEARL provides nitrogen, which may cause nitrogen poisoning of photoresist. A patterned mask 1824 for etching trenches is formed over the nitrogen barrier 1822 (step 1712). Typically, such a mask is formed with a photoresist material.

Figure 19:
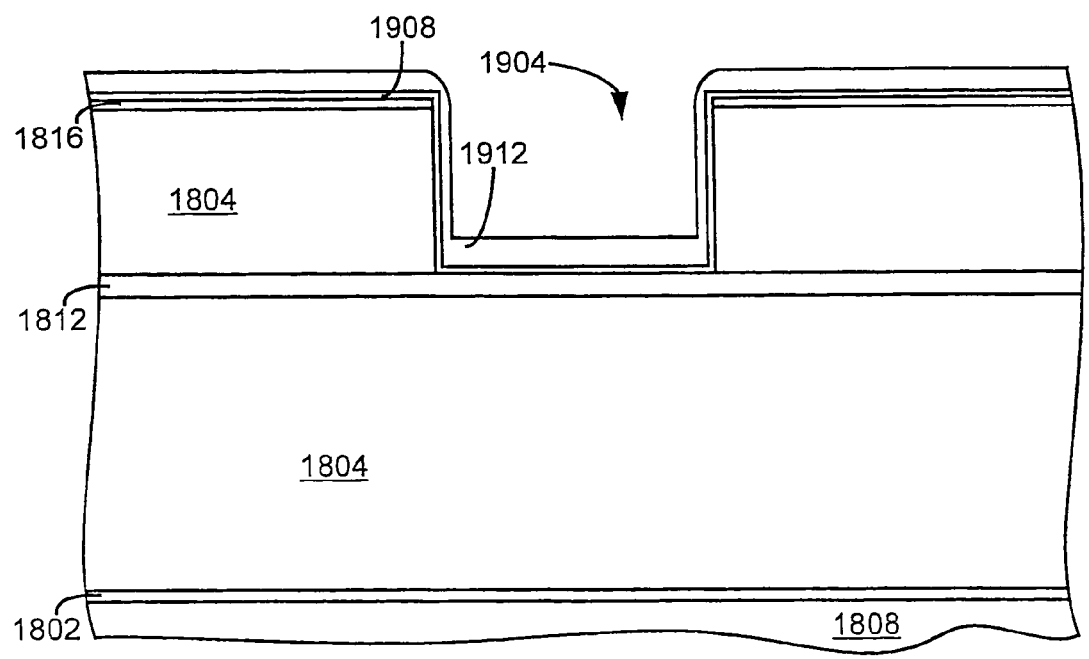
FIG. 19 is a cross-sectional view of the substrate illustrated in FIG. 18 after a trench has been etched.

The patterned mask is used to etch trenches 1904, as shown in FIG. 19 (step 1716). In this example, the first aperture is a trench. The trench forming mask and the antireflective coating may then be removed by ashing (step 1720). A poison barrier layer 1908 to prevent nitrogen from poisoning resist is formed over the surface of the trench opening 1904 (step 1724). This may be accomplished by using a chemical vapor deposition to deposit silicon and oxygen to form an oxide layer or by depositing other films that do not contain nitrogen. This step is another example of the step forming a poison barrier layer (step 508). A bottom antireflective coat (BARC) 1912 may be formed (step 1728) over the poison barrier layer 1908. In this example, the deposition of the BARC does not require an etch back of the BARC.

Figure 20:
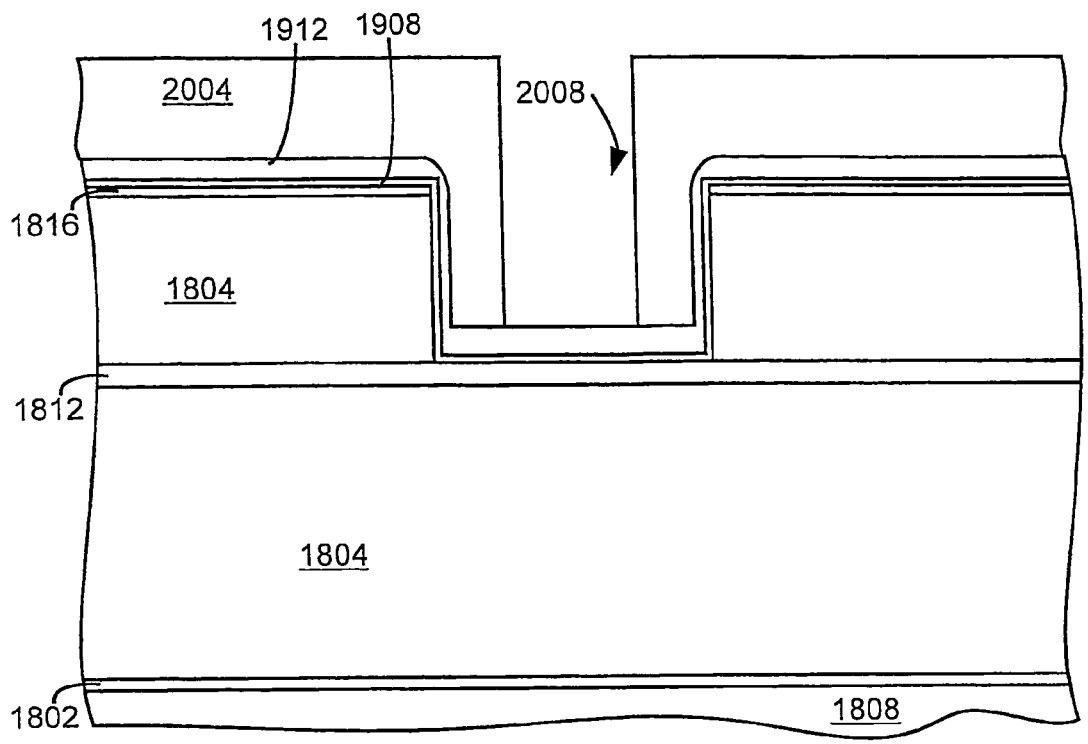
FIG. 20 is a cross-sectional view of the substrate illustrated in FIG. 19 after a via mask has been patterned.
Figure 21:
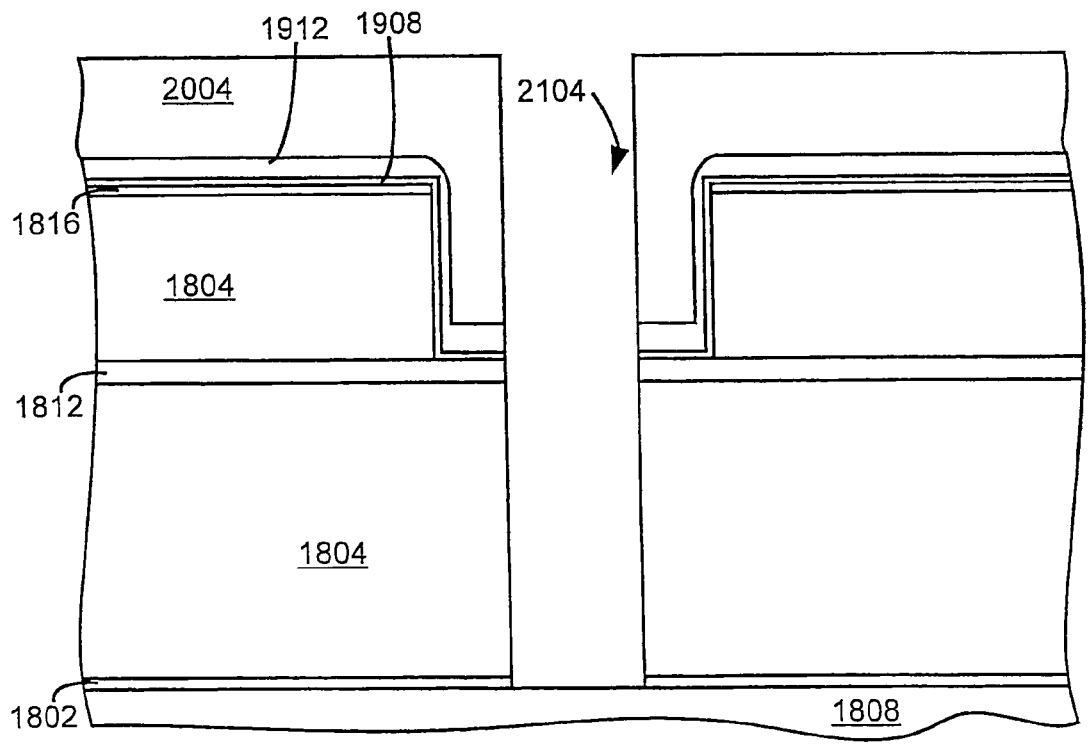
FIG. 21 is a cross-sectional view of the substrate illustrated in FIG. 20 after a via has been etched.

A patterned via mask 2004 may then be formed (step 1732), as shown in FIG. 20. The poison barrier layer 1912 is able to prevent resist poisoning from nitrogen migrating from the barrier layer 1802. As a result, acid formed during the developing of the photoresist is not neutralized, allowing for the formation of a via opening 2008 during the forming of the patterned mask, without photoresist adhering to locations in the via opening. A via 2104 is then etched, as shown in FIG. 21, using the patterned mask 2004 (step 1736). In this example, the second aperture is a via. The via is contained in the trench so that all of the second aperture, the via, shares the same area as part of the first aperture, the trench.

The patterned via mask may then be removed by ashing (step 1740). The BARC 1908 and the nitrogen barrier 1912 may also be removed during the ashing. The substrate may be heated to provide annealing and degassing (step 1744) to remove gases and moisture. A barrier layer may be formed (step 1748). Copper may be deposited over the barrier layer (step 1752) to form conductive interconnects. Chemical mechanical polishing may be used to provide a smooth upper surface (step 1756) of the conductive interconnects.

Other poison barriers layers that prevent nitrogen from poisoning resist may be formed from nitrogen free silicon carbide or metal. Although the invention is described for integration on low-K dielectric materials, the invention may also be applied to systems that use dielectric layers that are not low-K dielectrics.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for forming a dual damascene interconnect in a dielectric, comprising:
    etching a first aperture in the dielectric;
    forming a poison barrier layer over part of the dielectric, which prevents resist poisoning by blocking nitrogen;
    forming a patterned mask over the poison barrier layer; and
    etching a second aperture into the dielectric, wherein at least part of the first aperture shares the same area as at least part of the second aperture.

2. The method, as recited in claim 1, wherein one aperture is within another aperture.

3. The method, as recited in claim 1, wherein the first aperture is a via and the second aperture is a trench wherein the via is within the trench.

4. The method, as recited in claim 1, wherein the forming of the poison barrier layer comprises chemically treating surfaces of the first aperture to provide an $H^+$ rich surface.

5. The method, as recited in claim 4, wherein the chemically treating comprises providing a wet chemical treatment with a solution with a pH of less than 7.

6. The method, as recited in claim 1, wherein the forming of the poison barrier layer comprises forming a nitrogen free barrier over surfaces of the first aperture.

7. The method, as recited in claim 1, wherein the forming of the poison barrier layer comprises forming a nitrogen free silicon oxide layer.

8. The method, as recited in claim 1, wherein the dielectric is a low-K dielectric.

9. The method, as recited in claim 8, further comprising the step of placing a copper diffusion barrier layer over surfaces of the first aperture and second aperture.

10. The method, as recited in claim 9, further comprising filling the first aperture and second aperture with copper.

11. The method, as recited in claim 10, wherein one aperture is within another aperture.

12. The method, as recited in claim 10, wherein the first aperture is a via and the second aperture is a trench, wherein the via is within the trench.

13. The method, as recited in claim 10, wherein the forming of the poison barrier layer comprises chemically treating surfaces of the first aperture to provide an $^+$ rich surface.

14. The method, as recited in claim 13, wherein the chemically treating comprises providing a wet chemical treatment with a solution with a pH of less than 7.

15. The method, as recited in claim 10, wherein the forming of the poison barrier layer comprises forming a nitrogen free barrier over surfaces of the first aperture.

16. The method, as recited in claim 10, wherein the forming of the poison barrier layer comprises forming a nitrogen free silicon oxide layer.

* * * * *